United States Patent [19]

Kumagai et al.

[11] Patent Number: 5,043,223
[45] Date of Patent: Aug. 27, 1991

[54] MULTILAYER CERAMIC SUBSTRATE AND METHOD FOR MAKING THE SAME

[75] Inventors: Koichi Kumagai, Ikoma; Shinji Shimazaki, Yawata, both of Japan

[73] Assignee: Matsushita Electric Industrial Co., Ltd., Kadoma, Japan

[21] Appl. No.: 513,041

[22] Filed: Apr. 23, 1990

Related U.S. Application Data

[63] Continuation of Ser. No. 146,554, Jan. 21, 1988, abandoned.

[30] Foreign Application Priority Data

Jan. 22, 1987 [JP] Japan .................. 62-12873

[51] Int. Cl.$^5$ .................. B32B 17/00; B32B 17/06
[52] U.S. Cl. .................. 428/432; 174/256; 428/426; 428/433; 428/434; 428/688; 428/489; 428/699; 428/701; 428/702; 428/901; 501/32; 501/74; 501/123; 501/125
[58] Field of Search .................. 428/426, 432, 433, 434, 428/688, 689, 699, 701, 702, 901; 174/68.5; 501/32, 74, 123, 125

[56] References Cited

U.S. PATENT DOCUMENTS

| | | | |
|---|---|---|---|
| 4,533,435 | 8/1985 | Utsumi et al. | 428/432 X |
| 4,624,934 | 11/1986 | Kokubu | 501/17 |
| 4,634,634 | 1/1987 | Kondo et al. | 428/901 X |
| 4,649,070 | 3/1987 | Kondo et al. | 428/901 X |
| 4,649,125 | 3/1987 | Takeuchi et al. | 428/901 X |
| 4,689,270 | 8/1987 | Deckelmann et al. | 428/901 X |
| 4,732,794 | 3/1988 | Hyde | 428/901 X |
| 4,734,316 | 3/1988 | Hees et al. | 428/901 X |
| 4,759,965 | 7/1988 | Kato et al. | 428/901 X |
| 4,767,672 | 8/1988 | Fujinaka et al. | 428/901 X |

FOREIGN PATENT DOCUMENTS

| | | |
|---|---|---|
| 0064872 | 11/1982 | European Pat. Off. . |
| 0196035 | 10/1986 | European Pat. Off. . |
| 60-235744 | 11/1985 | Japan . |
| 61-205658 | 9/1986 | Japan . |
| 62-47195 | 3/1987 | Japan . |
| 1408256 | 10/1975 | United Kingdom . |

OTHER PUBLICATIONS

Toshio Minowa et al., "Low Temperatures Fired Laminated Ceramic Substrates", Denshizairyo, (Electronic Materials Monthly Publication) published by Kogyo Chosakai, pp. 48-49, vol. 26, No. 5.

*Primary Examiner*—Ellis P. Robinson
*Assistant Examiner*—Archene A. Turner
*Attorney, Agent, or Firm*—Cushman, Darby & Cushman

[57] ABSTRACT

A multilayer ceramic substrate comprises plural conductive layers and insulation layer for insulating the plural conductive layers, and the insulation layer is made of an inorganic composition comprising at least one member selected from the group of $Al_2O_3$ and $ZrO_2$, $SiO_2$, PbO, and at least one member selected from the group of BaO, CaO and ZnO in predetermined range. The multilayer ceramic substrate can be sintered at low temperature in the air and is splendid in a heat resistance, a solderability and resistance value of the insulation layer and furthermore, a microcrack is not caused in a laser trimming of a top resistance film.

6 Claims, 6 Drawing Sheets

MULTILAYER CERAMIC SUBSTRATE AND METHOD FOR MAKING THE SAME

This is a continuation of Application Ser. No. 07/146,554, filed on Jan. 21, 1988, which was abandoned upon the filling hereof.

FIELD OF THE INVENTION AND RELATED ART STATEMENT

1. Field of the Invention

The present invention relates generally to a multilayer substrate, and more particularly to a multilayer ceramic substrate which can be obtained by low temperature sintering and method for making the same.

2. Description of the Related Art

Recently ceramic substrates are widely used in various electronic circuits, since they are not only easy to form a circuit by thick film printing method but also splendid in heat radiation ability. Moreover, the multilayer ceramic substrate has come to be used for realizing a minimization and a high performance of the electronic circuits. The following three methods are generally known as the methods for making the multilayer ceramic substrate.

(A) Printing multilayer method on a sintered ceramic layer,
(B) Printing multilayer method on a green sheet, and
(C) Green sheet laminating multilayer method.

Figure 3:
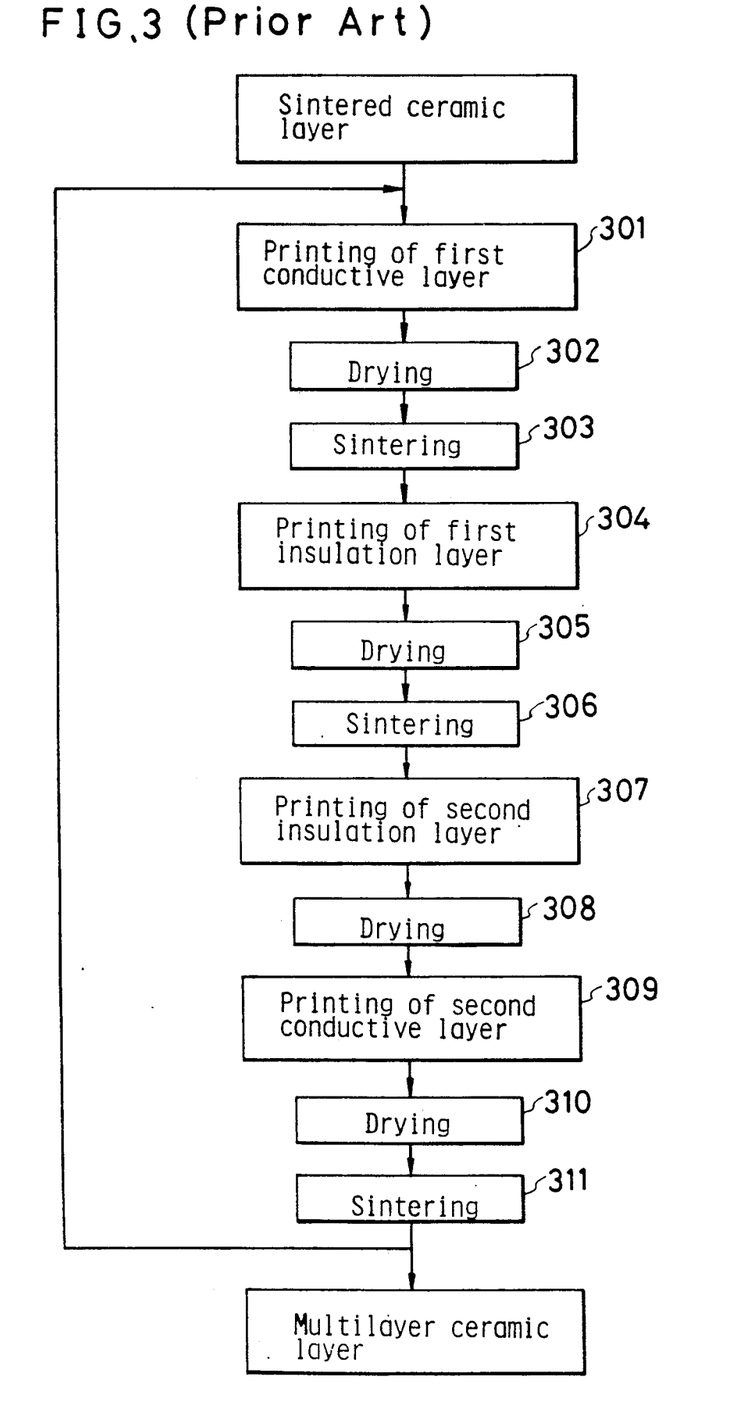
FIGS. 3, 4 and 5 are flow charts showing the conventional process for making a multilayer ceramic substrate.

With reference to FIG. 3, the method (A) is explained. A first conductive layer is printed on a sintered ceramic layer, and then is dried and sintered (Steps 301-303). Next, a first insulation layer is printed on the first conductive layer, and then it is dried and sintered (Steps 304-306). Then, a second insulation layer is printed on the first insulation layer and is dried. A second conductive layer is printed on the second insulation layer and is dried (Steps 309-310), and then sintered together with the second insulation layer (Step 311). In the above-mentioned process, the first and the second insulation layers are printed in a manner that small holes called as "via-holes" are formed therein and the same material as that of the second conductive layer is packed in the via-holes thereby connecting the first and second conductive layers. Next, third insulation layer is printed on the second insulation layer and it is dried and sintered. By the similar steps to those of forming of second insulation layer and thereafter, the conductive layers and insulation layers are laminated on and on.

Figure 5:
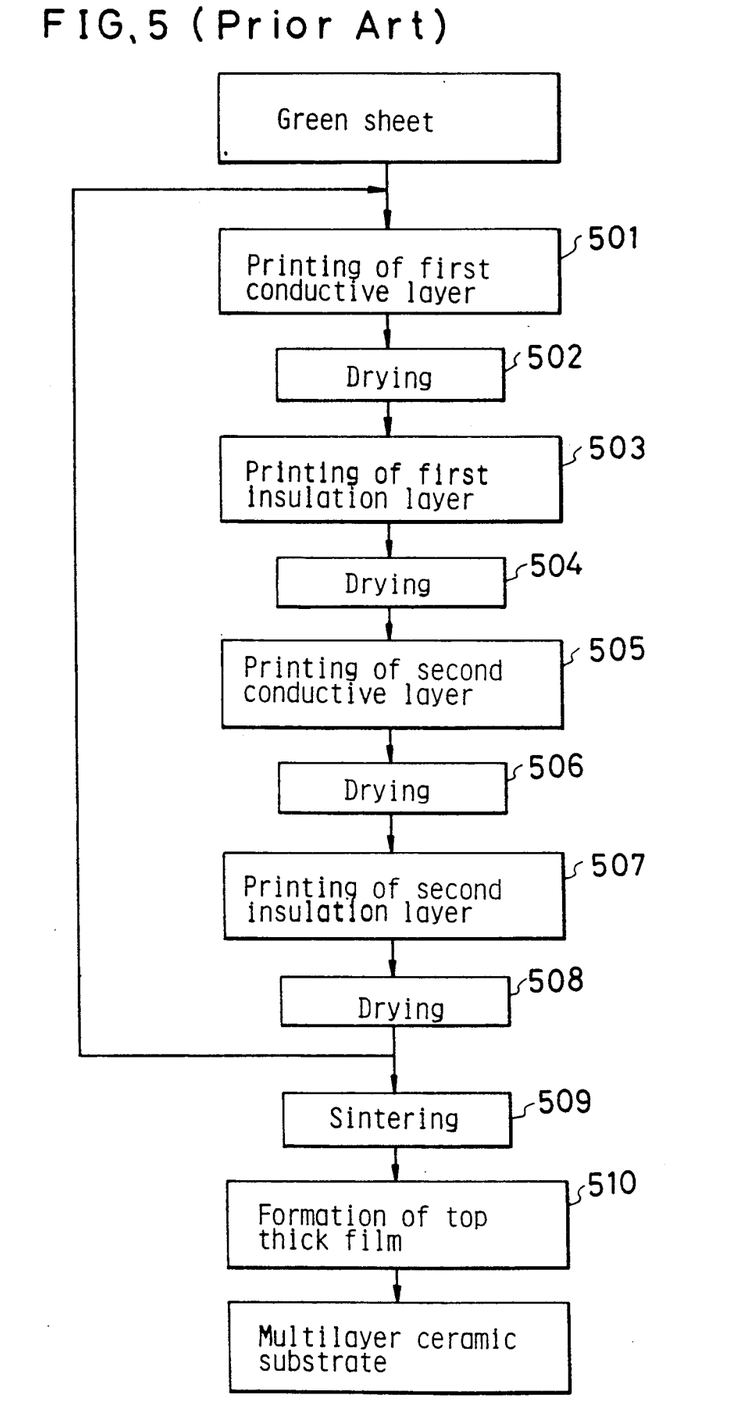

The method (B) is explained with reference to FIG. 5. A first conductive layer is printed on the ceramic green sheet which is to be a substrate after sintering (Step 501). Then it is dried (Step 502). A first insulation layer is printed on the first conductive layer and it is dried (Steps 503-504). Then a second conductive layer is printed on the first insulation layer and dried (Steps 505-506). A second insulation layer is printed on the second conductive layer, and then it is dried (Steps 507-508). Thereafter in the similar manner, printing and drying of the conductive layers and the insulation layers are repeated predetermined times, thereby making a multilayer structure. The multilayer structure is sintered as a whole. Then, top thick film comprising a top conductive layer, a top resistance layer and an overcoat glass is formed on the sintered multilayer substrate.

Figure 4:
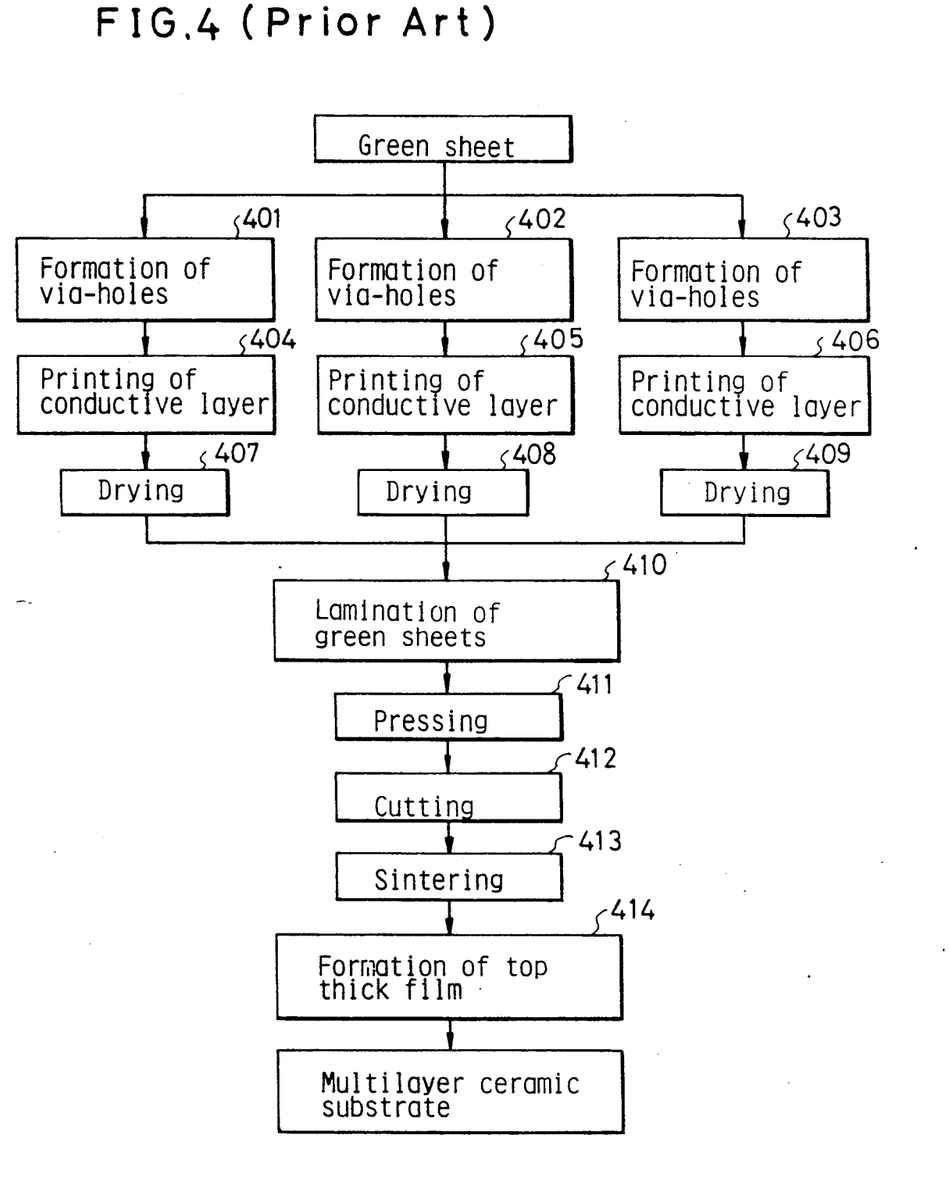

The method (C) is explained with reference to FIG. 4. Via-holes are formed in plural green sheets of ceramic (Steps 401-403). Patterns of the via-holes are different in each green sheets. Then conductive layers each having different patterns are printed on the green sheets and dried (Steps 404-409). Next, the green sheets having the different conductive pattern are laminated (Step 410) and pressed to bond them into one body under a proper pressure and temperature (Step 411). Then, the resultant sheet is cut into proper shapes and sizes and sintered (Steps 412-413). Conduction between each conductive layers is made by conductive material packed in the via-holes of the green sheets. Thereafter a top thick film is formed on the sintered multilayer substrate.

When the above-mentioned three methods (A), (B) and (C) are compared each other, in the method (A), though formation of multilayer structure is realized by a simple process, there is a problem of limit of lamination numbers, which is substantially at most 4-6. When the lamination number is more than the above, considerable concave and convex parts, namely unevenness is generated on the surface, and as a result it is not equal to practical use. In the method (B), it is possible to simplify making process by sintering the green sheet and printed insulation layer and printed conductive layer in one lot. However, the limit of lamination numbers are 4-6 just like the method (A), since the unevenness of the surface becomes considerable when the lamination number is large. In the method (C), the lamination number is not limited in theory. Moreover, lamination numbers of 30-40 have been actually realized. However, high grade techniques are required for making it, and there are many problems in the process for making it.

Among the above-mentioned three methods, the method (C) is most concerned with the present invention. In the following, the conventional green sheet laminating multilayer method is explained in detail with reference to FIG. 4.

FIRST EXAMPLE OF THE CONVENTIONAL METHOD

The first conventional example is a method for making a multilayer substrate of high temperature sintering type. Plural green sheets are prepared by making a mixture of alumina powder and organic matter into a layer having predetermined thickness. Each green sheets are provided with the via-holes having different pattern (steps 401-403), and the conductive layers having different pattern are printed thereon (Steps 404-406) and they are dried (Steps 407-409). As a conductive material for the conductive layer, such metals as W and Mo are mainly used. Packing of the conductive material into the via-holes is made prior to simultaneously with the printing of the conductive layer. After drying the conductive layer, a predetermined number of the green sheets each having different conductive pattern are laminated and made into one body with pressure under proper temperature (Steps 410-411). Next, it is cut into predetermined shape and size and is sintered at about 1600° C. in a reduction atmosphere, thereby producing a multilayer substrate (Steps 412 and 413). After sufficiently washing the sintered multilayer substrate, the top thick film is formed thereon (Step 414).

SECOND EXAMPLE OF THE CONVENTIONAL METHOD

The second example is method for making the multilayer substrate of low temperature sintering type as shown in Japanese published examined patent application Sho 59-22399. In the second conventional example, $B_2O_3$-$SiO_2$-PbO-$Al_2O_3$ system material is used for a ceramic layer. First, a mixture of $B_2O_3$-$SiO_2$-PbO-$Al_2O_3$ system material and organic matter is made into a sheet having a predetermined thickness, thereby preparing a green sheet. Plural green sheets are provided with via-holes in a manner that each green sheets has different via-holes pattern. Thereafter, conductive layers each having different pattern are printed on each green sheets and dried. Metals such as Ag, Au, Pd and Pt or alloy thereof are used as the conductive material. Packing of the conductive material into the via-holes is made prior to or simultaneously with the printing of the conductive layer. After drying the conductive layers, the green sheets each having different conductive pattern are laminated and made into one body with pressure under proper temperature. Next it is cut into a predetermined shape and size and sintered at a temperature of a range of 700°-1400° C. in the air, thereby producing the multilayer ceramic substrate. After fully washing the sintered multilayer substrate, the top thick film is formed thereon.

THIRD EXAMPLE OF THE CONVENTIONAL METHOD

The third conventional example is a method for making the multilayer ceramic substrate of a low temperature sintering type like the second example. This method is disclosed in a Japanese published unexamined patent application Sho 60-235744. In this example, $B_2O_3$-$SiO_2$-($Al_2O_3$ or $ZrO_2$) system material is used for the ceramic composition. A process for making the multilayer ceramic substrate is the same as that of the aforementioned second conventional example.

FOURTH EXAMPLE OF THE CONVENTIONAL METHOD

The fourth conventional example is made by the inventors of the present invention and disclosed in Japanese patent application (Tokugan) Sho 60-186918 corresponding to Japanese published unexamined patent application (Tokkai) Sho 62-47195 (publication date: Feb. 28, 1987). This example relates to a method for making a multilayer ceramic substrate of low temperature sintering type like the second and third conventional examples. In this fourth conventional method, $SiO_2$-PbO-($Al_2O_3$, $ZrO_2$ or $TiO_2$) system material is used for an insulation composition.

However, in the first conventional example, cost of equipment is large and operation thereof is difficult, since the sintering temperature is considerably high and the sintering must be made in a reducing atmosphere. Moreover, alumina is used as a material for the green sheet and the sintering temperature thereof is high. Therefore, only metals having high melting point such as W and Mo which have resistance value of 7-15 m$\Omega$/□ can be used for the conductive layer. As a result there is a problem that resistance of the conductive layer is high.

The conventional method of the second, third and fourth examples can solve the problems of the example 1. However, there are problems that the multilayer ceramic substrates of them are insufficient in a heat resistance and undesirable warpage is caused in the sintering process at a temperature of 850° C. after the printing and drying of the top thick film material. Further, there is a problem that when the insulation layer is sintered together with the conductive layer, constituent of the conductive layer disperses into the insulation layer, and hence, resistance value thereof becomes small, thereby inducing decrease of insulation ability.

Moreover in the multilayer ceramic substrate shown in the above-mentioned conventional examples 1-4, there is a problem that it is impossible to use the laser trimming method for trimming the top resistance layer for controlling the resistance thereof, since microcrack is caused on the top resistance layer and the insulation layer. Furthermore, in case that electronic components are mounted on the top conductive layer of the top thick film by soldering, solder wettability and soldering strength of the top conductive layer have been insufficient. That is, the generation of the microcrack and the solderability such as the solder wettability are dependent on component and composition of the ceramic insulation layer. Accordingly, in the conventional multilayer ceramic substrate, it is substantially impossible to form the top resistance layer in high resistance accuracy and to mount the electronic components by the soldering, and therefore, field of use thereof is limited to such electronic circuits that the top resistance layer or high resistance accuracy thereof are not necessary and to such substrate wherein other method than the soldering can be used for mounting the electronic components. Moreover, when the soldering can not be dispensable, the soldering should be made after plating a metal on the top thick film.

OBJECT AND SUMMARY OF THE INVENTION

The object of the present invention is to provide a multilayer ceramic substrate which can be sintered at low temperature in atmosphere and capable of laser trimming of a top resistance layer without causing microcrack, and is splendid in solderability.

Another object of the present invention is to provide a method for making the above-mentioned multilayer ceramic substrate.

These objects are accomplished by a multilayer ceramic substrate comprising:
at least two conductive layers,
at least one insulation layer for insulating the conductive layers comprising the following members calculated as oxide:
  at least one member selected from the group consisting of $Al_2O_3$ $ZrO_2$ of 32-58% by weight,
  $SiO_2$ of 13-30% by weight,
  PbO of 15-39% by weight, and
  at least one member selected from the group consisting of BaO, CaO and ZnO of 0.5-12% by weight.

Another multilayer ceramic substrate in accordance with the present invention comprises:
at least two conductive layers and
at least one insulation layer for insulating the conductive layers comprising the following members calculated as oxide:
  at least one member selected from the group consisting of $Al_2O_3$ and $ZrO_2$ of 39-51% by weight,
  $SiO_2$ of 19-25% by weight,
  PbO of 22-32% by weight and
  at least one member selected from the group consisting of BaO, CaO and ZnO of 2-8% by weight.

A method for making a multilayer ceramic substrate in accordance with the present invention comprises steps of:
preparing a slurry by mixing a binder and a composition comprising at least one member selected from the group consisting of $Al_2O_3$ and $ZnO_2$ of 39-51% by weight, $SiO_2$ of 19-25% by weight, PbO of 22-32% by weight and at least one member selected from the group consisting of BaO, CaO and ZnO of 2-8% by weight, preparing plural green sheets from the slurry,
providing via-holes in the green sheets,
packing a conductive material into the via-holes,
printing a conductive layer on the green sheets,
drying the conductive layer,
laminating the green sheets with pressure, and
sintering the laminated green sheets.

The multilayer ceramic substrate in accordance with the present invention has the insulation layer made of inorganic composition capable of the sintering under low temperature at about 870° C. -950° C., and shows splendid characteristics as a ceramic substrate for forming an electronic circuit.

In the present invention, at least one metal selected from the group of Ag, Au, Pd and Pt, or at least one alloy made of at least two members selected therefrom can be used as a material for the conductive layer. These material are hardly oxidized, and therefore, the reduction atmosphere is not required for the sintering. In the present invention, a low temperature sintering can be made in the air, and therefore, cost of equipment is lower, and operation thereof is simple.

Resistance value of Au and Ag (1-3 mΩ/□) is lower than those of W and Mo (7-15 mΩ/□).

Furthermore, the multilayer ceramic substrate of the present invention is splendid in a heat resistance, and therefore, even when the top thick film material is sintered at a temperature of about 850° C., warpage thereof is not caused. Moreover, the insulation layer has splendid resistance value, since the component of the inner conductive layer does not disperse into the insulation layer even when the insulation layer is sintered together with the inner conductive layer.

In the present invention, the microcrack is not caused in the laser trimming of the top resistance layer. Further, soldering mounting of the electronic components onto the top thick film is possible without plating treatment.

In the present invention, reasons for limiting the composition of the ceramic insulation layer are as follows:

$SiO_2$ is main constituent of the insulation layer (ceramic layer), and when $SiO_2$ is not more than 13% by weight (hereinafter "% by weight" is referred as "%") dispersion of shrinkage ratio of the insulation layer in the sintering process is large. Further, it is impossible to use metals having low melting point such as Ag, Au, Pt and Pd, since the sintering temperature is high. When $SiO_2$ is above 30%, a bending strength is very much small, and the shrinkage ratio in the sintering process is large, and therefore, resultant multilayer ceramic substrate can not be used for the practical use. Moreover, when $SiO_2$ is not in a range of 13-30%, characteristics of the sintering temperature, the shrinkage rate and the bending strength are almost satisfactory, but crystallization balance with other constituent elements is lost, and problems such as deterioration of the heat resistance and dispersion of the component of the inner conductive layer take place. That is, when $SiO_2$ amount is too large or too small, the crystallization balance is lost, to induce increase of amorphous part in the insulation layer. And as a result, softening of the substrate and transfer of the constituent thereof become considerable. Therefore, when the material of the top thick film is sintered at about 850° C. (at this time, the multilayer ceramic substrate is sintered again), considerable deformation of the top thick film such as the warpage is caused due to the softening of the underlying insulation layer. When the multilayer ceramic substrate is sintered being supported at both ends (not the whole surface), the deformation is most considerable. Moreover, when the transfer amount of the constituent is considerable, the constituent of the conductive layer disperses to the insulation layer and the constituent of the insulation layer disperses to the conductive layer, and as a result, resistance value of the insulation layer lowers. Further the dispersion of the constituent of the insulation layer into the top conductive layer is caused by loss of the crystallization balance and transfer of the constituent, thereby lowering the solder wettability and soldering strength. $SiO_2$ amount is more preferably 19-25%.

PbO is also one basic constituent of the insulation layer. When PbO is below 15%, the insulation layer has water absorption property and bending strength thereof is small. In case of poor bending strength, microcracks are caused on the resistance layer and the insulation layer, since they can not resist a heat-stress during the laser trimming. Moreover, when PbO is more than 39%, the deformation of the ceramic substrate during the sintering is remarkably large. Furthermore, when PbO is outside the range of 15-39%, the crystallization balance is lost like the above-mentioned case of $SiO_2$, and the same phenomenon and problems are caused. PbO is more preferably 22-32%.

BaO, CaO and ZnO are main constituents for bringing the crystallization of the insulation layer, and they have further purposes such as improving a sintering ability and a dielectric loss tangent of the insulation layer, and controlling a coefficient of thermal expansion thereof. When one member selected from the group of BaO, CaO and ZnO is below 0.5%, the sintering ability is insufficient, and when it is above 12%, the dielectric loss tangent is undesirably large. The coefficient of thermal expansion of the insulation layer is controlled depending on kind of the multilayer ceramic substrate wherein the insulation layer is used. When the insulation layer is used for an ordinary thick film hybrid integrated circuit; and especially in case of formation of the circuit is made by using a thick film conductive paste and a thick film resistance paste, it is desirable to adjust the coefficient of thermal expansion of the insulation layer to that of alumina to $(6.0-6.5) \times 10^{-6}/°C$. When a silicon chip of IC is directly mounted on the substrate, it is desirable to adjust the coefficient of the thermal expansion of the insulation layer to that of the silicon to $4 \times 10^{-6}/°C$. Although it is difficult to evaluate the insulation layer on the basis of only the coefficient of thermal expansion thereof, when the coefficients of the thermal expansion of the insulation layer is considerably different from those of alumina and silicon, the insulation layer can not be used in the practical use.

Moreover, the one member selected from the group of BaO, CaO and ZnO is not in a range of 0.5-12%, the crystallization balance is lost, and further, the microcrack is caused on the top resistance layer and the insulation layer during the laser trimming of the top resistance layer. Furthermore, there are problems such as deterioration of the resistance value of the insulation layer and poor solderability of the top conductive layer like the above-mentioned case wherein $SiO_2$ amount is not in preferable range. It is more preferable that at least one member selected from the group of BaO, CaO and ZnO is contained in a range of 2-8%.

$Al_2O_3$ and $ZnO_2$ are added as a core of crystallization and as a filler of the insulation layer. They improve the bending strength and suppress the dispersion of the sintering shrinkage ratio.

When, one member selected from the group of $Al_2O_3$ and $ZrO_2$ is below 32%, the bending strength of the insulation layer is excessively small and the dispersion of the sintering shrinkage ratio is large, and therefore resultant multilayer ceramic substrate can not be equal to the practical use. On the other hand when the one member selected from $Al_2O_3$ and $ZrO_2$ is above 58%, the sintering temperature becomes high and the sintering is apt to insufficient. As a result, the insulation layer has the water absorption property, and further, the bending strength of the insulation layer is small and the microcrack is caused thereon in the laser trimming of the top resistance layer. It is more preferable that at least one member selected from the group of $Al_2O_3$ and $ZrO_2$ is 39-51%

DESCRIPTION OF THE PREFERRED EMBODIMENT

Figure 1:
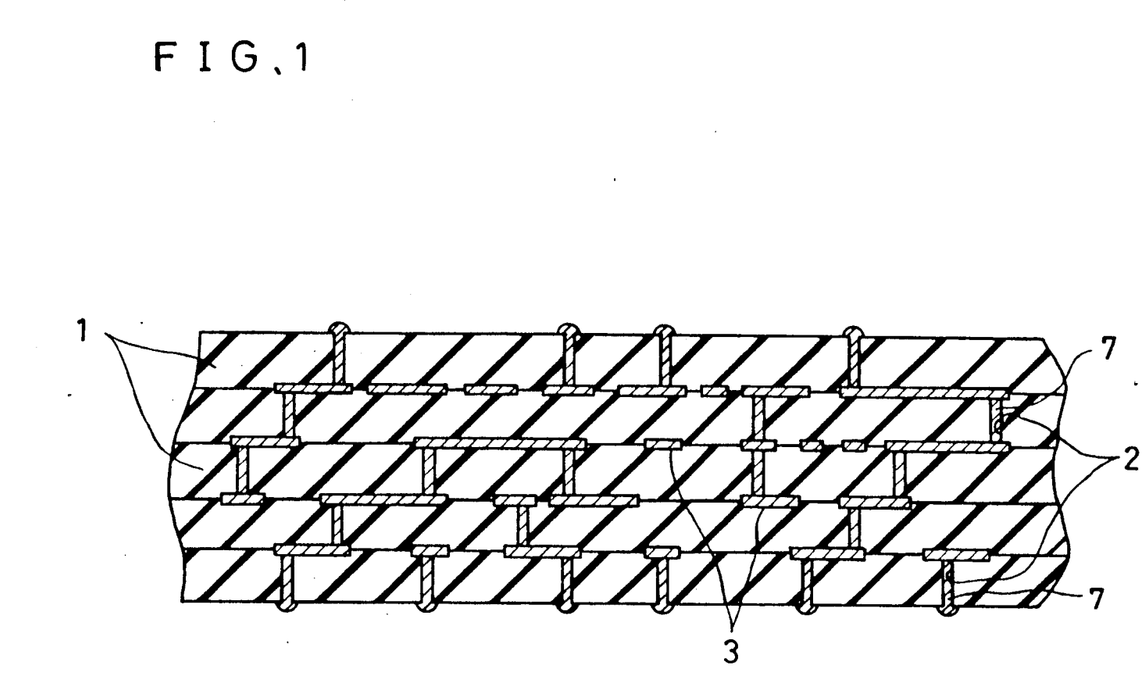
FIG. 1 is a sectional view showing a multilayer ceramic substrate of the present invention.
Figure 1A:
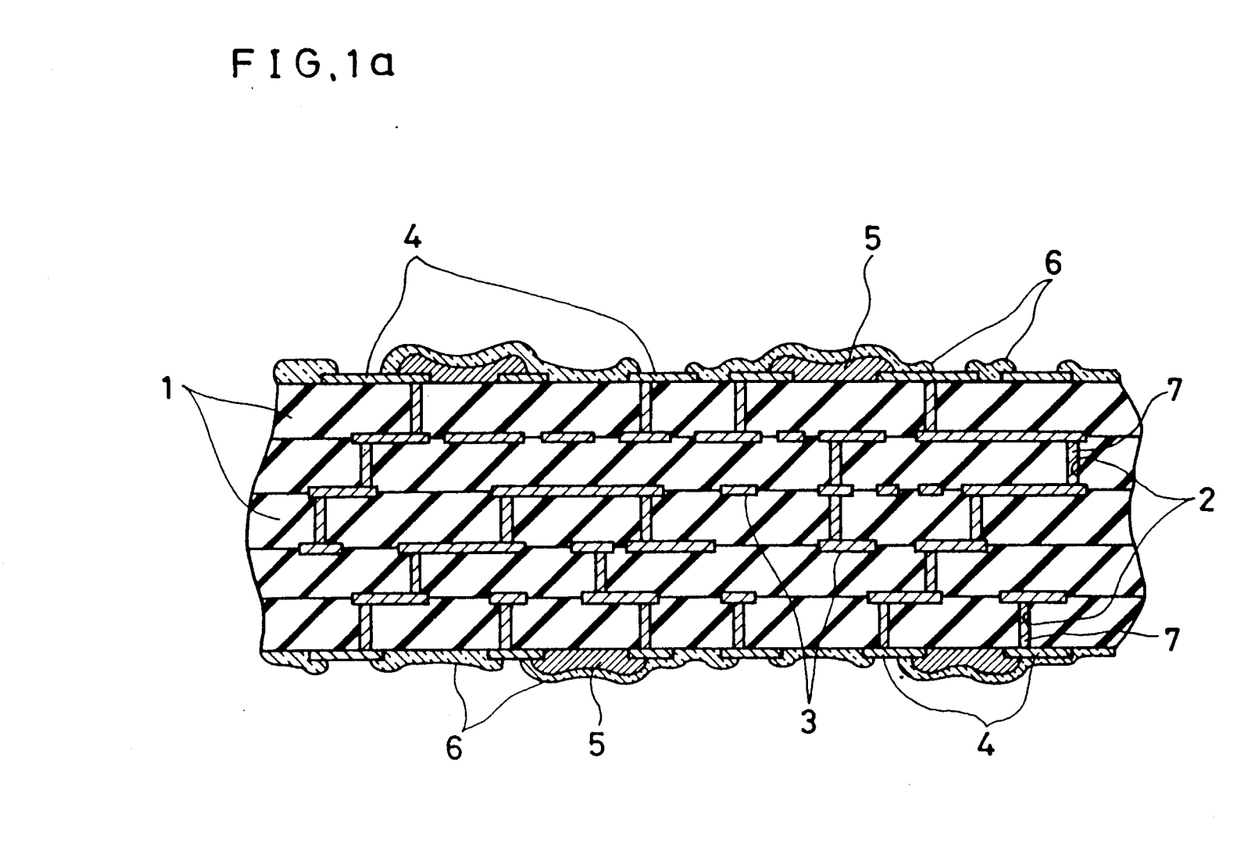
FIG. 1a is a sectional view showing a multilayer ceramic substrate with top thick films on both sides thereof.
Figure 2:
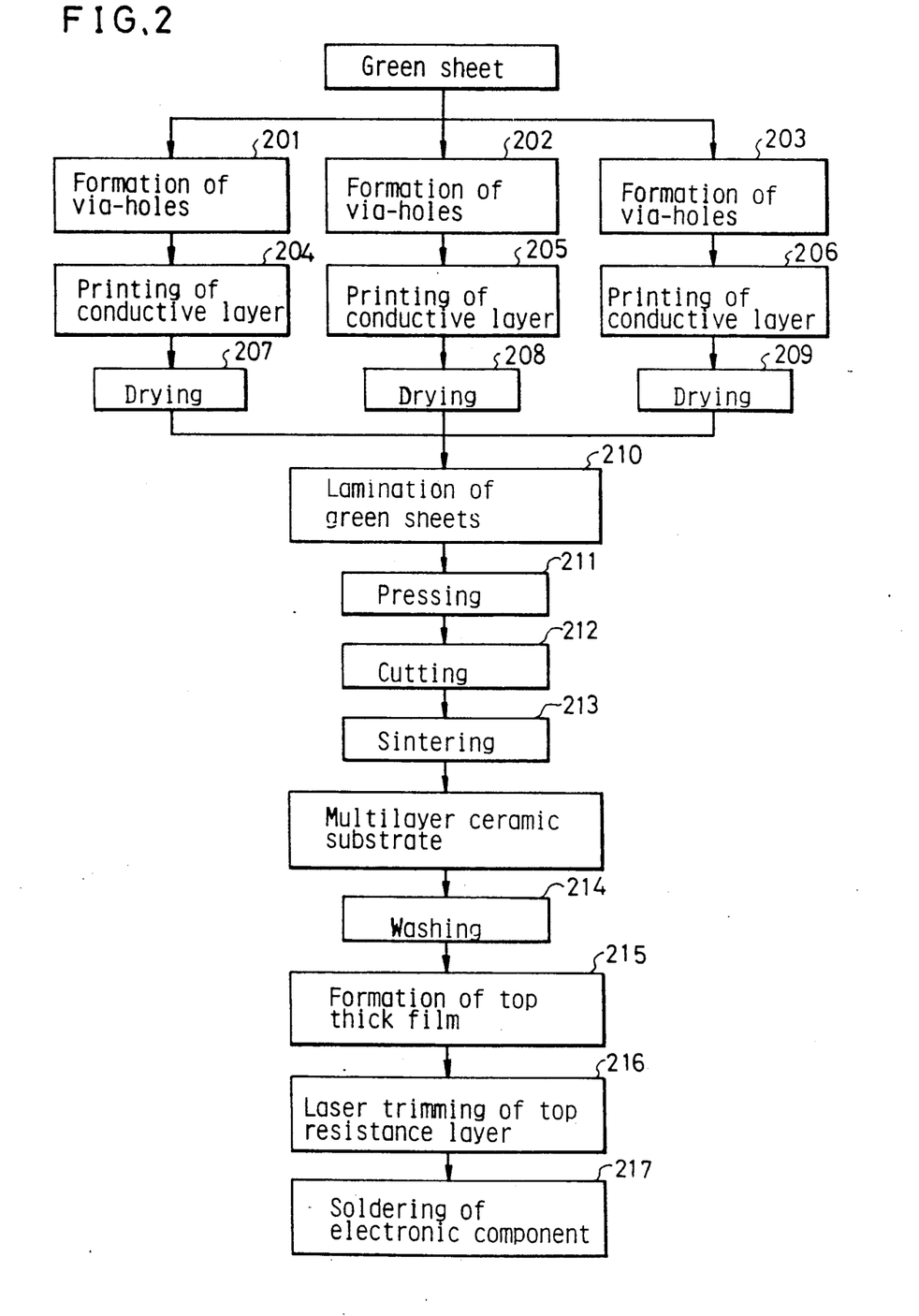
FIG. 2 is a flow chart showing an example of a process for making a multilayer ceramic substrate of the present invention.

In the following, a multilayer ceramic substrate embodying the present invention and method for making the same are explained with reference to FIGS. 1, 1a and 2.

First, each materials of a ceramic composition for an insulation layer such as $SiO_2$, $PbO$, $BaO$, $CaO$ and $ZnO$ are weighed out in a proportion of the following Table 1, and they are heated at 1400° C.-1500° C. for 1-3 hours to be melted, thereby making a glass plate by a process of, such as a roll-out method. This glass plate is ground into a powder having 0.5-5 μm of average particle diameter by using such as an alumina ball. Then filler such as $Al_2O_3$ and $ZrO_2$ having about equal particle diameter is added thereby obtaining the inorganic composition for the insulation layer. Though the above-mentioned materials are represented as oxide, other form of materials such as metal, carbonate and hydroxide can be used in known process.

TABLE 1

| Sample No. | Ceramic composition | | | | | Filler | |
|---|---|---|---|---|---|---|---|
| | $SiO_2$ | PbO | BaO | CaO | ZnO | $Al_2O_3$ | $ZrO_2$ |
| 1* | 9.0 | 23.5 | 3.5 | 1.0 | 2.5 | 35.5 | 25.0 |
| 2* | 13.5 | 13.0 | 2.0 | 13.0 | — | 58.8 | — |
| 3* | 24.0 | 31.5 | — | — | — | 23.5 | 21.0 |
| 4* | 36.5 | 32.0 | — | 10.0 | 3.5 | — | 18.0 |
| 5* | 12.5 | 24.0 | 3.5 | — | 7.0 | 53.0 | — |
| 6* | 25.0 | 14.5 | 4.0 | 1.5 | 5.5 | 41.5 | 8.0 |
| 7* | 21.0 | 22.5 | — | 0.3 | 0.1 | — | 56.1 |
| 8* | 28.5 | 34.5 | 3.0 | — | 4.0 | 30.0 | — |
| 9 | 14.0 | 32.5 | 7.0 | — | — | 46.5 | — |
| 10 | 28.0 | 17.0 | — | 7.0 | — | — | 48.0 |
| 11 | 25.5 | 23.5 | — | — | 1.0 | 30.5 | 19.5 |
| 12 | 22.0 | 36.0 | 3.0 | 2.5 | 2.0 | 34.5 | — |
| 13 | 20.0 | 25.0 | — | — | 10.0 | — | 45.0 |
| 14 | 25.0 | 23.0 | 8.0 | — | 1.0 | 24.5 | 18.5 |
| 15 | 21.5 | 33.0 | 1.5 | — | 1.5 | 40.0 | 2.5 |
| 16 | 26.5 | 29.0 | 4.0 | — | — | 40.5 | — |
| 17 | 24.5 | 30.0 | — | 2.5 | — | — | 43.0 |
| 18 | 23.0 | 31.0 | 2.5 | — | 2.5 | 41.0 | — |
| 19 | 19.5 | 24.5 | 4.0 | — | 3.5 | 22.5 | 26.0 |
| 20 | 22.5 | 23.0 | 2.0 | 1.0 | 1.0 | 50.5 | — |
| 21 | 29.5 | 20.0 | 0.5 | 1.0 | 1.0 | 3.0 | 45.0 |
| 22 | 19.0 | 38.5 | 1.5 | — | — | 41.0 | — |
| 23 | 20.0 | 20.0 | 6.0 | — | 5.5 | 47.0 | 1.5 |
| 24 | 20.0 | 18.0 | — | 4.5 | — | 54.5 | 3.0 |
| 25* | 31.0 | 19.0 | — | — | 1.0 | 49.0 | — |
| 26* | 14.0 | 40.5 | 1.0 | — | 1.0 | 29.5 | 14.0 |
| 27* | 20.5 | 22.5 | 7.0 | — | 6.0 | 3.0 | 41.0 |
| 28* | 14.0 | 19.0 | 4.0 | 0.5 | 3.5 | 31.0 | 28.0 |
| 29* | 34.5 | 15.5 | 1.0 | 1.0 | 1.0 | 47.0 | — |
| 30* | 14.0 | 45.0 | 0.5 | 0.5 | — | 10.0 | 30.0 |
| 31* | 23.0 | 19.5 | 10.0 | 3.0 | 4.5 | 30.0 | 10.0 |
| 32* | 14.5 | 18.5 | 1.0 | — | 1.0 | 60.0 | 5.0 |

*Comparison example

Next, a method for making the multilayer ceramic substrate embodying the present invention is described, wherein the above-mentioned inorganic composition is used. Polyvinyl butyral of 10 weight parts, dibutyl phthalate of 6 weight parts, glycelyl monooleate of 0.4 weight parts, 1,1,1-trichloroethane of 20 weight parts and isopropyl alcohol of 39 weight parts are added to 100 weight parts of the above-mentioned inorganic composition. Then they are mixed for 24 hours by using ball mill thereby making a slurry. A green sheet having 0.1 mm thickness is formed by applying the slurry on a polyester film by doctor-blade method. The green sheet 1 (which is made to be an insulation layer by the sintering) is fully aged, and then, fine holes as via-holes 2 are formed mechanically therein (Steps 201-203). Then, a conductive material 7 which is constituted of an alloy made of 95% of Ag and 5% of Pd is packed into the via-holes by a printing method using a metal mask.

Next, a conductive layer 3 made of the same conductive material as the above-mentioned conductive material 7 is printed on the green sheets 1 (Steps 204-206) and dried (Steps 107-109). Plural green sheets each having different via-holes patterns and different printing patterns of the conductive layer 3 are laminated (Step 210) and made into one body with a pressure of 200 Kg/cm² under a temperature of 80° C. (Step 211). After cutting into a predetermined configuration (Step 212), it is sintered under a condition of maximum temperature of 870°-1340° C. and retention time of the maximum temperature of 60 minutes (Step 213) thereby producing the multilayer ceramic substrate shown in FIG. 1. Sintered multilayer ceramic substrate is washed with water by an ultrasonic washing method (Step 214), and then, as shown in FIG. 1a top thick films (circuit) comprising top conductive layers 4, top resistance layers 5 and overcoat glasses 6 are formed on both sides thereof (Steps 215). The top resistance layer 4 is trimmed by laser trimming method (Step 216). Then electronic components are mounted on the top conductive layer by the soldering (Step 217), thereby producing the multilayer ceramic substrate for the electronic circuit.

Table 2 shows characteristics of the sintered multilayer ceramic substrate such as a bending strength, water absorption ratio and dielectric loss tangent.

bending strength is maximum with presuming approximate sintering temperature of the inorganic composition by a differential thermal analysis in advance. In

TABLE 2

| Sample No. | Sintering temperature (°C.) | Bending strength (Kg/cm²) | Water absorption ratio (%) | Dielectric loss tangent (× 10⁻³) | Warpage, Deformation | Sintering shrinkage ratio | |
|---|---|---|---|---|---|---|---|
| | | | | | | Average value (%) | Dispersion (%) |
| 1* | 1300+ | 1690 | 0.0 | 0.6 | not observed | 18.6 | ±0.9+ |
| 2* | 980 | 1250+ | 0.3+ | 0.7 | not observed | 16.5 | ±0.5 |
| 3* | 910 | 1800 | 0.7+ | 0.7 | not observed | 16.0 | ±0.5 |
| 4* | 920 | 1140+ | 0.0 | 7.0+ | not observed | 17.8 | ±0.8+ |
| 5* | 1200+ | 1780 | 0.0 | 1.0+ | not observed | 17.7 | ±0.8+ |
| 6* | 900 | 1280+ | 0.2+ | 0.4 | not observed | 16.9 | ±0.6 |
| 7* | 950 | 2100 | 0.5+ | 0.6 | not observed | 15.9 | ±0.6 |
| 8* | 930 | 1400+ | 0.0 | 6.0+ | not observed | 19.1 | ±1.0+ |
| 9 | 900 | 2000 | 0.0 | 0.5 | not observed | 18.0 | ±0.5 |
| 10 | 980 | 2200 | 0.0 | 0.5 | not observed | 16.8 | ±0.6 |
| 11 | 920 | 2100 | 0.0 | 0.9 | not observed | 14.5 | ±0.5 |
| 12 | 920 | 2350 | 0.0 | 0.8 | not observed | 13.5 | ±0.4 |
| 13 | 900 | 2400 | 0.0 | 0.3 | not observed | 13.5 | ±0.4 |
| 14 | 880 | 2650 | 0.0 | 0.3 | not observed | 16.2 | ±0.4 |
| 15 | 880 | 2800 | 0.0 | 0.2 | not observed | 15.8 | ±0.3 |
| 16 | 900 | 3000 | 0.0 | 0.3 | not observed | 16.5 | ±0.4 |
| 17 | 910 | 3100 | 0.0 | 0.2 | not observed | 17.0 | ±0.5 |
| 18 | 890 | 3000 | 0.0 | 0.2 | not observed | 16.0 | ±0.4 |
| 19 | 870 | 2800 | 0.0 | 0.3 | not observed | 14.5 | ±0.5 |
| 20 | 880 | 2700 | 0.0 | 0.3 | not observed | 14.5 | ±0.3 |
| 21 | 920 | 2200 | 0.0 | 0.6 | not observed | 15.5 | ±0.5 |
| 22 | 900 | 2100 | 0.0 | 0.7 | not observed | 16.5 | ±0.5 |
| 23 | 950 | 2200 | 0.0 | 0.5 | not observed | 17.0 | ±0.6 |
| 24 | 920 | 2400 | 0.0 | 0.5 | not observed | 16.5 | ±0.5 |
| 25* | 930 | 1900 | 0.0 | 0.9 | not observed | 17.0 | ±0.6 |
| 26* | 950 | 1900 | 0.0 | 0.7 | observed+ | 17.3 | ±0.7+ |
| 27* | 980 | 2100 | 0.0 | 7.2+ | not observed | 16.0 | ±0.5 |
| 28* | 1300+ | 1450+ | 1.0+ | 0.8 | not observed | 17.5 | ±0.7+ |
| 29* | 960 | 2200 | 0.0 | 3.3+ | observed+ | 16.5 | ±0.6 |
| 30* | 950 | 2300 | 0.0 | 0.9 | observed+ | 17.0 | ±0.6 |
| 31* | 970 | 2100 | 0.0 | 10.1+ | not observed | 16.8 | ±0.7+ |
| 32* | 1150+ | 1400+ | 1.5+ | 2.5+ | not observed | 17.5 | ±0.8+ |

| Sample No. | Heat resistant temperature (°C.) | Depth of dispersion of constituent of conductive layer (μm) | Micro-crack | Solderability | |
|---|---|---|---|---|---|
| | | | | Solder wettability (φ mm) | Soldering strength (Kg/mm²) |
| 1* | 600+ | 30+ | not observed | 6.2+ | 0.25+ |
| 2* | 680+ | 22+ | observed+ | 4.8+ | 0.20 |
| 3* | 620+ | 18+ | observed+ | 5.2+ | 0.30 |
| 4* | 820 | 9 | not observed | 6.8 | 0.50 |
| 5* | 680+ | 24+ | not observed | 6.0+ | 0.35 |
| 6* | 720+ | 48+ | observed+ | 5.5+ | 0.30 |
| 7* | 700+ | 30+ | observed+ | 4.8+ | 0.35 |
| 8* | 820 | 7 | not observed | 6.8 | 0.50 |
| 9 | 830 | 5 | not observed | 6.9 | 0.55 |
| 10 | 830 | 4 | not observed | 7.0 | 0.50 |
| 11 | 850 | 5 | not observed | 6.8 | 0.50 |
| 12 | 830 | 5 | not observed | 6.8 | 0.50 |
| 13 | 900 | 5 | not observed | 7.3 | 0.60 |
| 14 | 880 | 2 | not observed | 7.5 | 0.55 |
| 15 | 880 | 1 | not observed | 7.5 | 0.60 |
| 16 | 900 | 3 | not observed | 7.2 | 0.60 |
| 17 | 910 | 2 | not observed | 7.0 | 0.55 |
| 18 | 890 | 3 | not observed | 7.4 | 0.60 |
| 19 | 870 | 1 | not observed | 7.2 | 0.55 |
| 20 | 880 | 1 | not observed | 7.2 | 0.55 |
| 21 | 850 | 5 | not observed | 6.9 | 0.50 |
| 22 | 880 | 7 | not observed | 7.0 | 0.55 |
| 23 | 900 | 8 | not observed | 7.0 | 0.55 |
| 24 | 850 | 8 | not observed | 7.2 | 0.50 |
| 25* | 720+ | 13+ | not observed | 5.2+ | 0.35+ |
| 26* | 700+ | 17+ | not observed | 5.1+ | 0.25+ |
| 27* | 780+ | 15+ | observed+ | 4.0+ | 0.30+ |
| 28* | 820 | 9 | observed+ | 7.0 | 0.50 |
| 29* | 720+ | 20+ | not observed | 5.3+ | 0.20+ |
| 30* | 650+ | 32+ | not observed | 5.8+ | 0.10+ |
| 31* | 600+ | 48+ | observed+ | 4.0+ | 0.15+ |
| 32* | 820 | 9 | observed+ | 6.8 | 0.50 |

*Comparison example
+Characteristics which are not suitable for the multilayer ceramic substrate The sintering temperature of Table 2 is selected in a manner that the water absorption ratio is 0 and the evaluation of deformation, the substrates are judged as not equal to practical use, when concave and convex, warpage, undulation or the like are observed with the eye on the surface thereof after the sintering.

As for a heat resistance of the sintered substrate, a temperature whereat warpage of above 0.3 mm/100 mm is observed under a condition that the substrate is supported at both end in 100 mm span and a retention time of peak temperature is 15 minutes is regarded as a heat resistant temperature. When the heat resistant temperature is above 820° C., there is no problem in the practical use. It is more preferable when above 850° C. The dispersion of constituent of the conductive layer is measured from a characteristic X ray image of a section of the substrate. (In this embodiment, especially the dispersion of Ag was observed.) When the depth of the dispersion is below 10 $\mu$m, there is no problem in the practical use, but the depth above 10 $\mu$m is not preferable. It is more preferable depth is below about 3 $\mu$m.

Generation of the microcrack of the top resistance layer at the laser trimming is measured by observing the surface and the section thereof by an electron microscope.

A solder wettability is evaluated by a diameter of spread solder under the condition of putting a 63Sn-37Pb solder disk having 4 mm diameter and 2.85 mm thick on the top conductive layer and reflowing it at 230° C. When the diameter of the spread solder is below 6.7 mm, the solder wettability is judged as insufficient.

A soldering strength is evaluated by measuring a thick film adhesion strength of soldered wire to the top conductive layer by under the condition of soldering a plated wire of 0.6 mm diameter to the top conductive layer with the 63Sn-37Pb solder and pulling it after bending it in right angle to the top conductive layer (so called, pealing method). The substrate showing the thick film adhesion strength of above 0.5 Kg/cm$^2$ is regarded as good.

For reference, characteristics of 96% Al$_2$O$_3$ layer which is the conventional insulation layer are shown in Table 3.

TABLE 3

| Main constituent 96% Al$_2$O$_3$ | |
|---|---|
| Sintering temperature | 1550 (°C.) |
| Bonding strength | >3000 (Kg/cm$^2$) |
| Water absorption ratio | 0.0 (%) |
| Dielectric loss tangent | 0.3 × 10$^{-3}$ |
| Warpage.Deformation | not observed |
| Sintering shrinkage ratio | |
| Average value | 18.5 (%) |
| Dispersion | ±0.5 (%) |
| Heat resistant temperature | 1400 (°C.) |
| Depth of dispersion of constituent of conductive layer | 5 ($\mu$m) |
| Microcrack | not observed |
| Solderability | |
| Solder wettability | $\phi$7.2 (mm) |
| Soldering strength | 0.55 (Kg/mm$^2$) |

As mentioned above, the multilayer ceramic substrate of the present invention can be sintered under such low temperature as 870°–980° C., and has sufficient characteristics as the multilayer ceramic substrate for the electronic circuit. Further, its characteristics are superior to those of the conventional multilayer ceramic substrate wherein the insulation layer is made of conventional material such as 96% Al$_2$O$_3$ system material containing B$_2$O$_3$-SiO$_2$-PbO-Al$_2$O$_3$ and B$_2$O$_3$-SiO$_2$ system material containing Al$_2$O$_3$ or ZrO$_2$.

According to the present invention, the metals having low melting point which have low resistance value can be used as the conductive material, since the sintering temperature for forming the multilayer ceramic substrate is low. Therefore it is possible to lower the resistance value of resultant multilayer ceramic substrate and decrease the cost of equipment. The resistance value of the insulation layer does not lower, since the dispersion of constituent of the inner conductive layer into the insulation layer can be suppressed. Further, there is no problem of the warpage of the substrate because of splendid heat resistance. Moreover, it is possible to control the resistance value of the top resistance layer in high precision, since the microcrack is not caused on the top resistance layer and the insulation layer at the process of the laser trimming of the top resistance layer. Moreover, the solderability is splendid, and therefore, it is possible to mount the electronic components on the top conductive layer by the soldering.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A multilayer ceramic substrate comprising:
   at least two conductive layers, and
   at least one insulation layer consisting of Al$_2$O$_3$ or ZrO$_2$ and lead-silicate glasses for insulating said conductive layers consisting essentially of the following members calculated as oxide:
   at least one member selected from the group consisting of Al$_2$O$_3$ and ZrO$_2$ of 32–58% by weight,
   SiO$_2$ of 13–30% by weight,
   PbO of 15–39% by weight and
   at least one member selected from the group consisting of BaO, CaO and ZnO of 0.5–12% by weight.

2. A multilayer ceramic substrate comprising:
   at least two conductive layers, and
   at least one insulation layer consisting of Al$_2$O$_3$ or ZrO$_2$ and lead-silicate glasses for insulating said conductive layers consisting essentially of the following members calculated as oxide:
   at least one member selected from the group consisting of Al$_2$O$_3$ and ZrO$_2$ of 39–51% by weight,
   SiO$_2$ of 19–25% by weight,
   PbO of 22–32% by weight and
   at least one member selected from the group consisting of BaO, CaO and ZnO of 2–8% by weight.

3. A multilayer ceramic substrate in accordance with claim 1 or 2, wherein,
   said conductive layer is made of at least one metal selected from the group consisting of Ag, Au, Pd and Pt.

4. A multilayer ceramic substrate in accordance with claim 1 or 2, wherein
   said conductive layer is made of at least one alloy made of at least two members selected from the group consisting of Ag, Au, Pd and Pt.

5. A multilayer ceramic substrate in accordance with claim 1 or 2, wherein
   a top resistance layer or a top conductive layer are further formed on a surface of said multilayer ceramic substrate.

6. A laser trimmed multilayer ceramic substrate in accordance with claim 5.

* * * * *